United States Patent
Chang

(10) Patent No.: US 8,222,149 B2
(45) Date of Patent: Jul. 17, 2012

(54) METHOD FOR PHOTORESIST PATTERN REMOVAL

(75) Inventor: Ching-Yu Chang, Yuansun Village (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 201 days.

(21) Appl. No.: 12/564,200

(22) Filed: Sep. 22, 2009

(65) Prior Publication Data

US 2010/0075478 A1 Mar. 25, 2010

Related U.S. Application Data

(60) Provisional application No. 61/099,058, filed on Sep. 22, 2008.

(51) Int. Cl.
*H01L 21/311* (2006.01)

(52) U.S. Cl. ........ 438/700; 438/725; 438/745; 438/756; 438/948; 438/949

(58) Field of Classification Search .................. 438/700, 438/725, 745, 756, 948, 949, FOR. 132, FOR. 389
See application file for complete search history.

(56) References Cited

U.S. PATENT DOCUMENTS

| | | | | | |
|---|---|---|---|---|---|
| 4,495,026 | A | * | 1/1985 | Herberg | 438/652 |
| 5,605,602 | A | * | 2/1997 | DeBusk | 438/476 |
| 5,773,889 | A | * | 6/1998 | Love et al. | 257/737 |
| 6,579,766 | B1 | * | 6/2003 | Tews et al. | 438/275 |
| 7,371,691 | B2 | * | 5/2008 | Hall et al. | 438/725 |
| 7,450,295 | B2 | * | 11/2008 | Tung et al. | 359/290 |
| 7,635,625 | B2 | * | 12/2009 | Lee | 438/241 |
| 2005/0124149 | A1 | * | 6/2005 | Kim et al. | 438/618 |
| 2005/0164127 | A1 | * | 7/2005 | Reid et al. | 430/311 |
| 2007/0257294 | A1 | * | 11/2007 | Cheng et al. | 257/306 |
| 2008/0180783 | A1 | * | 7/2008 | Wang et al. | 359/291 |
| 2008/0311690 | A1 | * | 12/2008 | Tu et al. | 438/29 |

* cited by examiner

*Primary Examiner* — N Drew Richards
*Assistant Examiner* — Joannie A Garcia
(74) *Attorney, Agent, or Firm* — Haynes and Boone, LLP

(57) ABSTRACT

The present disclosure provides a method for making a semiconductor device. The method includes forming a sacrificial layer on a substrate; forming a patterned resist layer on the sacrificial layer; performing an ion implantation to the substrate; applying a first wet etch solution to remove the patterned photoresist layer; and applying a second wet etch solution to remove the sacrificial layer.

21 Claims, 2 Drawing Sheets

METHOD FOR PHOTORESIST PATTERN REMOVAL

CROSS REFERENCE

This application claims the benefit of U.S. Provisional Application No. 61/099,058 entitled "Method for Photoresist Pattern Removal," filed Sep. 22, 2008, herein incorporated by reference in its entirety.

BACKGROUND

In advanced technology nodes of semiconductor industry, metal and high k dielectric material are used to form a metal gate stack of a field-effect transistor (FET). When forming a metal gate FET, one or more ion implanting processes are used to form doped features of the FET. A patterned photoresist layer is used as a mask in the ion implanting process. The patterned photoresist layer is removed thereafter. However, when a dry stripping process is used to remove the patterned photoresist layer, the substrate is recessed. When a wet stripping is used to remove the patterned photoresist layer, the photoresist residue cannot be completely removed.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

DETAILED DESCRIPTION

Figure 1:
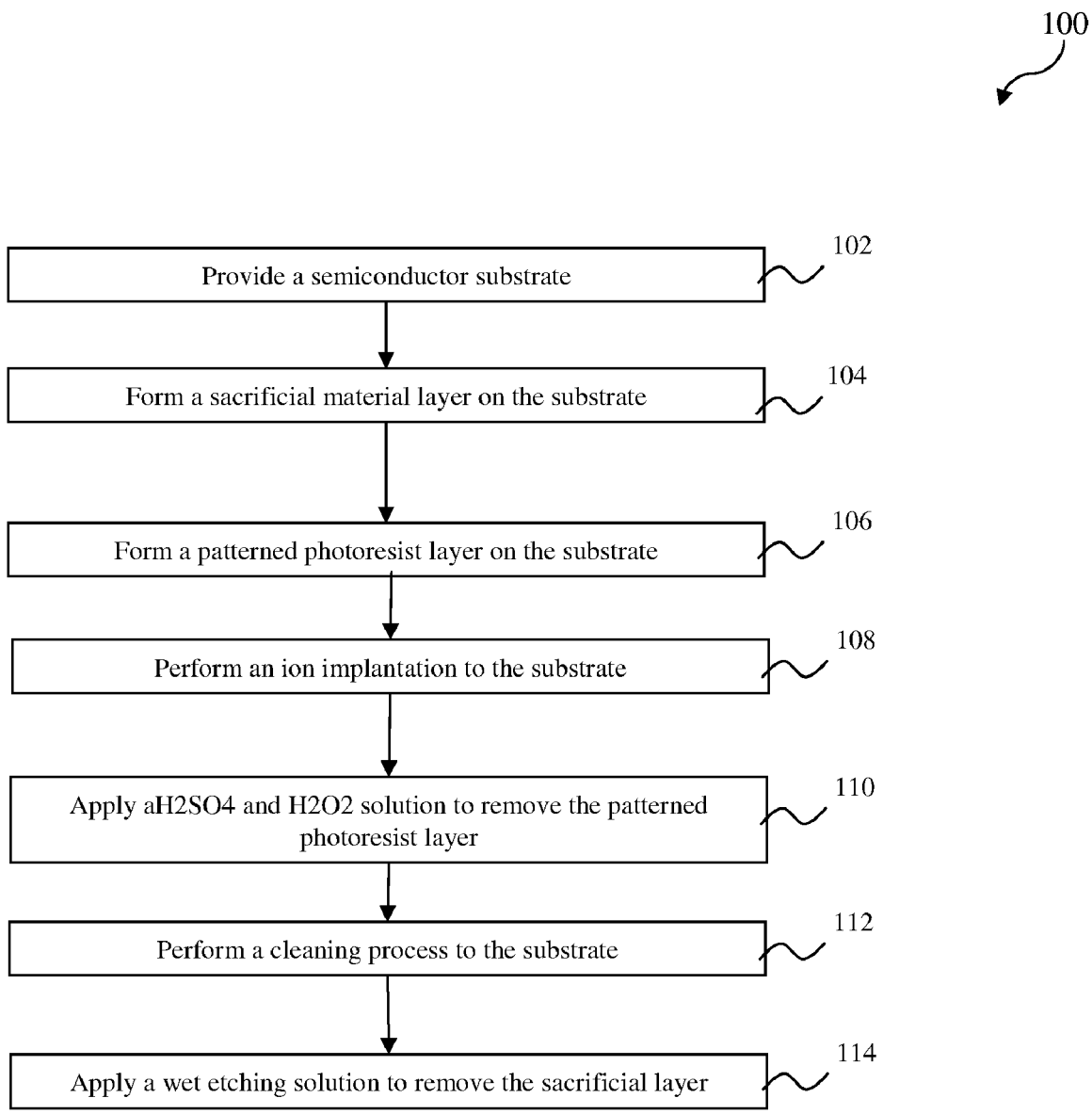
FIG. 1 is a flowchart of a method making a semiconductor device in one embodiment constructed according to aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIG. 1 is a flowchart of one embodiment of a method 100 making a semiconductor device having a metal gate stack constructed according to aspects of the present disclosure. FIGS. 2 through 6 are sectional views of one embodiment of a semiconductor structure 200 at various fabrication stages. The method 100 of making a semiconductor device is described with reference to FIGS. 2 through 6.

Figure 2:
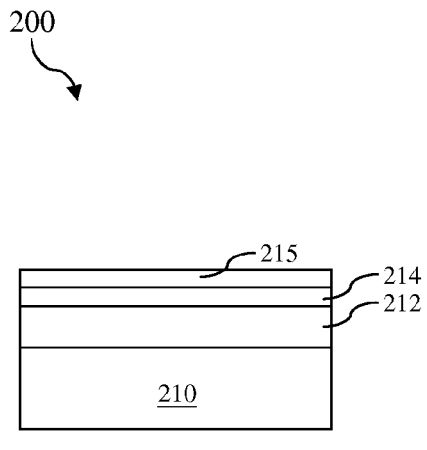
FIGS. 2 through 6 are sectional views of one embodiment of a semiconductor structure having a metal gate stack at various fabrication stages constructed according to aspects of the present disclosure.

Referring to FIGS. 1 and 2, the method 100 begins at step 102 by providing a semiconductor substrate 210. The semiconductor substrate 210 includes silicon. Alternatively, the substrate 210 includes germanium, silicon germanium or other suitable semiconductor material, such as diamond, silicon carbide or gallium arsenic. The substrate 210 may further include additional features and/or material layers, such as various isolation features formed in the substrate. The substrate 210 may include various p-type doped regions and/or n-type doped regions configured and coupled to form various devices and functional features. All doping features may be achieved using a suitable process, such as ion implantation in various steps and techniques. The substrate 210 may include other features, such as a shallow trench isolation (STI).

The substrate 210 may further include various material layers, such as metal-gate-stack material layers. A high k dielectric material layer 212 may be formed on the semiconductor substrate 210. The high k dielectric material layer is formed by a suitable process such as an atomic layer deposition (ALD). Other methods to form the high k dielectric material layer include metal organic chemical vapor deposition (MOCVD), physical vapor deposition (PVD), UV-Ozone Oxidation and molecular beam epitaxy (MBE). In one embodiment, the high k dielectric material includes $HfO_2$. Alternatively, the high k dielectric material layer includes metal nitrides, metal silicates or other metal oxides.

A metal layer 214 is formed on the high k material layer. In one embodiment, the metal layer includes titanium nitride (TiN). Alternatively, the metal layer includes tantalum nitride (TaN), copper (Cu), tungsten silicon (WSi), tantalum (Ta), tantalum nitride (TaN), aluminum oxide (AlOx), aluminum (Al), tungsten (W), hafnium (Hf) or lanthanum (La) or other suitable metal. The metal layer is formed by a physical vapor deposition (PVD) technique, chemical vapor deposition (CVD) or other suitable method, such as atomic layer deposition (ALD).

An interfacial layer (IL) may be interposed between the semiconductor substrate 210 and the high k dielectric material layer. The interfacial layer may include a thin silicon oxide layer and is formed on the silicon substrate 210 before forming the high k dielectric material layer. The thin silicon oxide layer may be formed by atomic layer deposition (ALD) or thermal oxidation.

A capping layer may be further formed on the high k dielectric material layer. In one embodiment, the capping layer includes lanthanum oxide (LaO). In another embodiment, the capping layer includes aluminum oxide ($Al_2O_3$). The capping layer may alternatively includes other suitable material.

Figure 3:
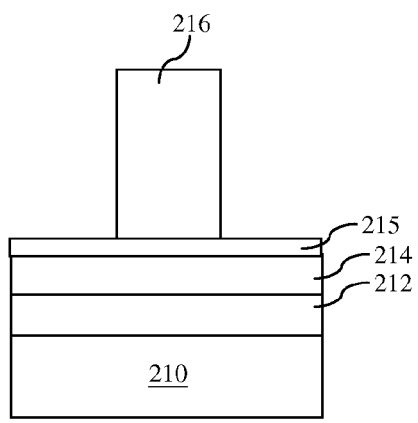

Referring to FIGS. 1 and 2, the method 100 begins at step 104 by forming a sacrificial layer 215 on the substrate, as illustrated in FIG. 3. The sacrificial layer has a higher etch selectivity relative to the substrate such that the sacrificial layer can be removed by a specific chemical without damaging the substrate. The sacrificial layer 215 includes lanthanum oxide (LaO). Alternatively, the sacrificial layer includes an oxide selected from silicon oxide, silicon oxynitride, hafnium oxide, aluminum oxide and tungsten oxide. The sacrificial layer has a thickness less than about 200 angstrom. In one example, the sacrificial layer has a thickness of about 20 angstrom. The sacrificial layer can be formed by PVD, chemical vapor deposition (CVD) or other suitable method.

Referring to FIGS. 1 and 3, the method 100 proceeds to step 106 by forming a patterned photoresist layer 216 on the substrate 210. The patterned photoresist layer 216 is used as a mask to pattern the sandwich structure, including the first, second and third layers. Particularly, the patterned photoresist layer 216 is formed on the third layer as illustrated in FIG. 3. The patterned photoresist layer is formed by a photolithography process. An exemplary photolithography process may include processing steps of photoresist coating, soft baking, mask aligning, exposing, post-exposure baking, developing photoresist and hard baking. When applying the developing solution to the exposed photoresist layer, the sacrificial layer underlying the exposed photoresist region (for positive photoresist) is partially or completely removed as well.

The lithography process may implement krypton fluoride (KrF) excimer lasers, argon fluoride (ArF) excimer lasers, ArF immersion lithography, extreme ultra-violet (EUV) or electron-beam writing (e-beam). The photolithography exposing process may also be implemented or replaced by other proper methods such as maskless photolithography, ion-beam writing, and molecular imprint.

Figure 4:
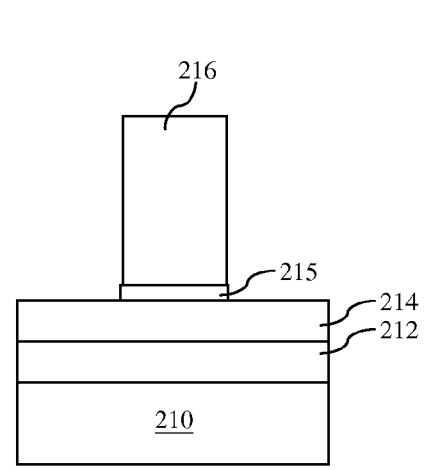

Referring to FIGS. 1 and 4, the method 100 may include an additional wet etching step after the formation of the patterned resist layer. At this step, the sacrificial layer is patterned using the patterned photoresist layer as a mask. In one example, $CO_2$ water is used to remove the sacrificial layer within the openings of the patterned photoresist layer. Alternatively, the additional wet etching step is skipped such that the sacrificial layer remains within the openings of the patterned photoresist layer.

Still referring to FIGS. 1 and 4, the method 100 proceeds to step 108 by performing an ion implanting process to the substrate. The patterned photoresist layer functions as an implantation mask. In one example, the ion implanting process is used to form various source and drain features, such as light-doped drain (LDD) features. In this case, the metal layer and high k dielectric material layer are used to formed metal gate stack. At this step, the method may alternatively include another fabrication step, such as an etching process, using the patterned photoresist as a processing mask.

Figure 5:
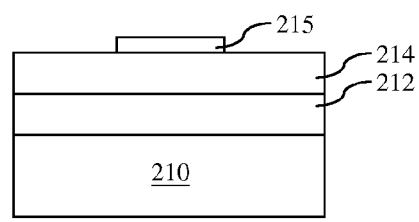

Referring to FIGS. 1 and 5, the method 100 proceeds to step 110 by applying a first wet etch solution to the substrate to remove the patterned photoresist layer. In one embodiment, the first wet etch solution includes a Caros solution, containing sulfuric acid ($H_2SO_4$) and peroxide ($H_2O_2$), applied to the substrate to remove the patterned photoresist layer. The $H_2SO_4$ and $H_2O_2$ ratio in the solution ranges from about 1:1 to about 100:1. The solution temperature during the processing ranges from about 50 C to about 180 C. Alternatively, the patterned photoresist layer is removed by a chemical solution selected from O3 water, sulfuric acid ($H_2SO_4$) and ozone ($O_3$), $O_3$, $H_2SO_4$ and $H_2O_2$, N-methyl-2-pyrrolidine (NMP), cyclohexanol, cyclopentanol, propylene glycol monomethyl ether (PGME), and Propylene glycol monomethyl ether acetate (PGMEA). In another embodiment, the patterned photoresist layer is removed by a chemical solution selected from oxidant based solution. As one example, the first wet etch solution includes $H_2SO_4$ and $O_3$, applied to the substrate to remove the patterned photoresist layer.

Referring to FIGS. 1 and 5, the method 100 may proceed to step 112 by applying a cleaning process to clean organic residue or other residues after the removal of the patterned photoresist layer. The cleaning material is capable of removing the organic residue. As one example, the cleaning material includes solvent, surfactant or polymer ingredient.

Figure 6:
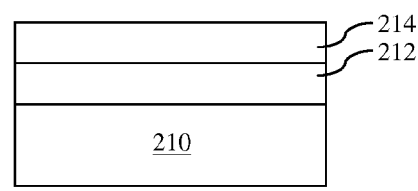

Referring to FIGS. 1 and 6, the method 100 proceeds to step 114 by applying a second wet etch solution to the semiconductor structure to remove the sacrificial layer 215. In one embodiment, the wet etching process utilizes hydrochloric acid (HCl). For example, the wet etching solution includes HCl and water ($H_2O$). The $HCl/H_2O$ ratio may range from about 1:1 to about 1:1000. The HCl solution may have a processing temperature ranging between about 20 C and about 80 C. The etching duration may have a range between about 5 seconds and about 5 minute. In another embodiment, the second wet etching solution includes an etchant having a pH value less than 7. In another embodiment, the second wet etching solution includes HF, $NH_4OH$, $NH_4F$, $H_2O$, $H_2O_2$, $HNO_3$, $CH_3COOH$, carboxylic acid or surfactant.

An additional cleaning step may follow after the wet etching process to remove the sacrificial layer. The cleaning process is capable to clean organic residue or other residues after the removal of the sacrificial layer. As one example, the cleaning material includes solvent, chemical, surfactant or polymer ingredient.

Various advantages may be present in various applications of the disclosed method. In one example, the applied ion implantation may substantially crosslink the photoresist polymeric matrix and make it hard to remove. The disclosed wet etching method can effectively remove the photoresist with reduced damage to the substrate. The substrate recess after the photoresist removal is substantially reduced or eliminated. The photoresist residue is decreased by using the sacrificial layer as a protection layer. When the sacrificial layer is removed, the photoresist residue after photoresist resist Caros/clean is removed as well. The sacrificial layer has high etch rate so that it can be etched away using the wet chemical. Any defects or residue on the sacrificial layer can be undercut and dissolved in wet chemical, the residue and defect are thus lifted off from the wafer surface. Moreover, the sacrificial layer can improve the PR adhesion.

Although not shown, other processing step may present to form various doped regions such as source and drain regions, devices features such as multilayer interconnection (MLI). In one example, the substrate may alternatively include other material layer to be patterned by the disclosed method. In another example, additional patterning steps may be applied to the substrate to pattern the metal gate stack. In another example, the source and drain features are formed after the formation of the gate stack. A gate spacer may be formed on the sidewalls of the metal gate stack. Then the source and drain regions are formed substantially aligned with the outer edges of the spacers. The gate spacers may have a multilayer structure and may include silicon oxide, silicon nitride, silicon oxynitride, or other dielectric material. The doped source and drain regions and LDD regions of either an n-type dopant or a p-type dopant are formed by a conventional doping process such as ion implantation. N-type dopant impurities employed to form the associated doped regions may include phosphorus, arsenic, and/or other materials. P-type dopant impurities may include boron, indium, and/or other materials.

The multilayer interconnection are further formed. The multilayer interconnection includes vertical interconnects, such as conventional vias or contacts, and horizontal interconnects, such as metal lines. The various interconnection features may implement various conductive materials including copper, tungsten and silicide. In one example, a damascene process is used to form copper related multilayer interconnection structure. In another embodiment, tungsten is used to form tungsten plug in the contact holes.

The semiconductor substrate may further include additional isolation features to isolate each from other devices. The isolation features may include different structures and can be formed using different processing technologies. For example, an isolation feature may include shallow trench isolation (STI) features. The formation of STI may include etching a trench in a substrate and filling the trench by insulator materials such as silicon oxide, silicon nitride, or silicon oxynitride. The filled trench may have a multi-layer structure such as a thermal oxide liner layer with silicon nitride filling the trench. In one embodiment, the STI structure may be created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical planarization (CMP) to etch back, and using nitride stripping to leave the STI structure.

The present disclosure is not limited to applications in which the semiconductor structure includes a MOS transistor, and may be extended to other integrated circuit having a metal gate stack. For example, the semiconductor structure 200 may include a dynamic random access memory (DRAM) cell, a single electron transistor (SET), and/or other microelectronic devices (collectively referred to herein as microelectronic devices). Of course, aspects of the present disclosure are also applicable and/or readily adaptable to other type of transistor, including single-gate transistors, multiple-gate transistors, strained semiconductor substrate, a hetero-semiconductor device, and may be employed in many different applications, including sensor cells, memory cells, logic cells, and others.

Although embodiments of the present disclosure have been described in detail, those skilled in the art should understand that they may make various changes, substitutions and alterations herein without departing from the spirit and scope of the present disclosure. In one example, if the sacrificial material is lathanum oxide, the wet etching chemical can be HCL or an acid material, the acid material can be TARC or acid polymer or polymer with acid molecular. In another example, If the ion implanting process presents after the formation of the patterned photoresist layer, the sacrificial layer within the openings of the patterned photoresist layer is removed before performing the ion implanting process. Thus, the sacrificial material will not influence the substrate since it is removed. the implant ion bombard will not drive any species from the sacrificial layer into the substrate.

In one embodiment, the disclosed method is used to form one or more metal-oxide-semiconductor field-effect-transistors (MOSFETs). In another embodiment, the disclosed method is used to form a metal gate stack in a gate-first process in which the metal gate stack is formed by the disclosed method and remains in the final structure. In another embodiment, the semiconductor substrate may include an epitaxial layer. For example, the substrate may have an epitaxial layer overlying a bulk semiconductor. Further, the substrate may be strained for performance enhancement. For example, the epitaxial layer may include a semiconductor material different from those of the bulk semiconductor such as a layer of silicon germanium overlying a bulk silicon, or a layer of silicon overlying a bulk silicon germanium formed by a process including SEG. Furthermore, the substrate may include a semiconductor-on-insulator (SOI) structure such as a buried dielectric layer.

Thus, the present disclosure provides a method for making a semiconductor device. The method includes forming a sacrificial layer on a substrate; forming a patterned resist layer on the sacrificial layer; performing an ion implantation to the substrate; applying a sulfuric acid (H2SO4) and peroxide (H2O2) solution to remove the patterned photoresist layer; or perform a cleaning process to the substrate; and applying a wet etch solution to remove the sacrificial layer.

In one embodiment of the disclosed method, the first wet etch solution includes sulfuric acid (H2SO4) and peroxide (H2O2). In another embodiment, the first wet etch solution includes sulfuric acid (H2SO4) and ozone (O3). In another embodiment, the sacrificial layer includes lanthanum oxide (LaO). The second wet etch solution may include hydrochloric acid (HCl) or carboxylic acid. In another embodiment, the sacrificial layer includes an oxide material. The oxide material may include a material selected from the group consisting of silicon oxide, silicon oxynitride, hafnium oxide, aluminum oxide, and tungsten oxide. The second wet etch solution may include an etching chemical selected from the group consisting of HF, NH4OH, NH4F, H2O, H2O2, HNO3, CH3COOH, and surfactant. The method may further include applying a cleaning material to the patterned photoresist layer before the applying the applying the ion implantation. The substrate may further include a high k dielectric material layer; and a metal layer on the high k dielectric material layer. The metal layer may include a metal selected from the group consisting of W, WSi, Al, Cu, AlOx, Hf, La, Ti, TiN, Ta and TaN. In one embodiment, the forming the patterned photoresist layer includes spin-coating a photoresist solution on the substrate; exposing the photoresist layer; and developing the photoresist layer, resulting in the patterned photoresist layer. The developing of the photoresist layer may additionally pattern the sacrificial layer. The method may further include applying a CO2 water to pattern the sacrificial layer.

The present disclosure also provides a method for making a semiconductor device. The method includes forming a sacrificial layer on a substrate; forming a patterned resist layer on the sacrificial layer; performing an ion implantation to the substrate; applying a chemical solution to remove the patterned photoresist layer; and applying a hydrofluoric (HCl) solution to remove the sacrificial layer.

The disclosed method may further include a cleaning process to the substrate after the applying the chemical solution to remove the patterned photoresist layer. In one embodiment, the sacrificial layer includes lanthanum oxide (LaO). The HCL solution may include a HCL concentration ranging between about 1:1 and about 1:1000 and a temperature ranging between about 20 C and about 80 C. The applying the HCL solution may have a duration ranging between about 5 second and about 5 minutes. The sacrificial layer may alternatively include a material selected from the group consisting of lanthanum oxide, silicon oxide, silicon oxynitride, hafnium oxide, aluminum oxide and tungsten oxide. The chemical solution may include an etching chemical selected from the group consisting of acid based solution, carboxylic acid solution, H2SO4 and H2O2, H2SO4 and O3, N-methyl-2-pyrrolidine (NMP), cyclohexanol, cyclopentanol, propylene glycol monomethyl ether (PGME), and Propylene glycol monomethyl ether acetate (PGMEA).

The present disclosure also provides a method for making a semiconductor device. The method includes forming a first metal layer on a substrate; forming a lanthanum oxide ((LaO) layer on the metal layer; forming a patterned photoresist layer on the LaO layer; performing a fabrication process to the substrate; applying a sulfuric acid (H2SO4) and peroxide (H2O2) solution to remove the patterned photoresist layer;

and applying a hydrofluoric (HCl) solution to remove the LaO layer 21. The fabrication process includes an ion implanting process in one embodiment. The fabrication process include an etching process in another embodiment.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method for making a semiconductor device comprising:
    forming a sacrificial layer on a substrate;
    forming a patterned resist layer on the sacrificial layer;
    patterning the sacrificial layer using the patterned resist layer as a mask;
    performing an ion implantation to the substrate while the patterned resist layer and the patterned sacrificial layer are on the substrate;
    applying a first wet etch solution to remove the patterned resist layer; and
    applying a second wet etch solution to remove the sacrificial layer.

2. The method of claim 1, wherein the sacrificial layer comprises lanthanum oxide (LaO).

3. The method of claim 1, wherein the first wet etch solution comprises an etchant having a sulfuric acid ($H_2SO_4$) and peroxide ($H_2O_2$).

4. The method of claim 1, wherein the first wet etch solution comprises an etchant having a sulfuric acid ($H_2SO_4$) and ozone ($O_3$).

5. The method of claim 1, wherein the first wet etch solution comprises an etchant having ozone ($O_3$).

6. The method of claim 1, wherein the second wet etch solution comprises an etchant having a pH value less than 7.

7. The method of claim 1, wherein the second wet etch solution comprises an etchant having a hydrochloric acid (HCl).

8. The method of claim 1, wherein the sacrificial layer comprises an oxide material.

9. The method of claim 8, wherein the oxide material comprises a material selected from the group consisting of silicon oxide, silicon oxynitride, hafnium oxide, aluminum oxide, and tungsten oxide.

10. The method of claim 1, wherein the substrate further comprises:
    a high k dielectric material layer; and
    a metal layer on the high k dielectric material layer.

11. The method of claim 10, wherein the metal layer comprises a metal selected from the group consisting of W, WSi, Al, Cu, AlOx, Hf, La, Ti, TiN, Ta, and TaN.

12. The method of claim 1, wherein the forming the patterned photoresist layer comprises
    spin-coating a photoresist solution on the substrate;
    exposing the photoresist layer; and
    developing the photoresist layer, resulting in the patterned photoresist layer.

13. The method of claim 12, wherein the developing the photoresist layer additionally patterns the sacrificial layer.

14. The method of claim 1, further comprising applying a $CO_2$ water to pattern the sacrificial layer.

15. The method of claim 1, wherein the second wet etch solution comprises an etching chemical selected from the group consisting of HF, $NH_4OH$, $NH_4F$, $H_2O$, $H_2O_2$, $HNO_3$, $CH_3COOH$, HCL, carboxylic acid, and surfactant.

16. A method for making a semiconductor device comprising:
    forming a high-k dielectric layer on a substrate;
    forming a metal layer on the high-k dielectric layer;
    forming a sacrificial layer on the metal layer;
    forming a patterned resist layer on the sacrificial layer;
    performing an ion implantation to the substrate while the patterned resist layer and the patterned sacrificial layer are on the substrate;
    applying a chemical solution to remove the patterned resist layer; and
    applying an acid solution to remove the sacrificial layer.

17. The method of claim 16, wherein the sacrificial layer comprises lanthanum oxide (LaO).

18. The method of claim 16, wherein the acid solution comprises a HCL concentration ranging between about 1:1 and about 1:1000, and a temperature ranging between about 20 C and about 80 C.

19. The method of claim 18, wherein the applying the HCL solution comprises a duration ranging between about 5 second and about 5 minutes.

20. The method of claim 16, wherein the sacrificial layer comprises a material selected from the group consisting of lanthanum oxide, silicon oxide, silicon oxynitride, hafnium oxide, aluminum oxide, and tungsten oxide.

21. The method of claim 16, wherein the chemical solution comprises an etching chemical selected from the group consisting of oxidant based solution, $H_2SO_4$ and $H_2O_2$, $H_2SO_4$ and $O_3$, $O_3$, N-methyl-2-pyrrolidine (NMP), cyclohexanol, cyclopentanol, propylene glycol monomethyl ether (PGME), and Propylene glycol monomethyl ether acetate (PGMEA).

* * * * *